United States Patent
Cher et al.

(10) Patent No.: US 8,549,363 B2
(45) Date of Patent: Oct. 1, 2013

(54) RELIABILITY AND PERFORMANCE OF A SYSTEM-ON-A-CHIP BY PREDICTIVE WEAR-OUT BASED ACTIVATION OF FUNCTIONAL COMPONENTS

(75) Inventors: Chen-Yong Cher, Port Chester, NY (US); Paul W. Coteus, Yorktown Heights, NY (US); Alan Gara, Mount Kisco, NY (US); Eren Kursun, Ossining, NY (US); David P. Paulsen, Dodge Center, MN (US); Brian A. Schuelke, Rochester, MN (US); John E. Sheets, II, Zumbrota, MN (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 12/727,967

(22) Filed: Mar. 19, 2010

(65) Prior Publication Data

US 2011/0173432 A1    Jul. 14, 2011

Related U.S. Application Data

(60) Provisional application No. 61/293,559, filed on Jan. 8, 2010.

(51) Int. Cl.
*G06F 11/30* (2006.01)
(52) U.S. Cl.
USPC ........... 714/47.3; 702/182; 702/184; 702/186
(58) Field of Classification Search
USPC ...................................................... 714/47.3
See application file for complete search history.

(56) References Cited

U.S. PATENT DOCUMENTS

| | | | |
|---|---|---|---|
| 5,862,394 A | 1/1999 | Watts et al. | |
| 7,272,732 B2 | 9/2007 | Farkas et al. | |
| 7,310,737 B2 | 12/2007 | Patel et al. | |
| 7,440,297 B2 | 10/2008 | Adragna et al. | |
| 7,472,038 B2 | 12/2008 | Bose et al. | |
| 7,486,107 B1 | 2/2009 | Bose et al. | |
| 7,681,081 B2 | 3/2010 | Wang | |
| RE43,516 E | 7/2012 | Adragna et al. | |
| 2001/0003207 A1 | 6/2001 | Kling et al. | |
| 2002/0169580 A1* | 11/2002 | Lehoczky | 702/181 |
| 2002/0171398 A1 | 11/2002 | Odaohhara | |
| 2003/0015983 A1 | 1/2003 | Montero et al. | |

(Continued)

OTHER PUBLICATIONS

United States Office Action dated Aug. 17, 2012 from related U.S. Appl. No. 12/727,984.

(Continued)

*Primary Examiner* — Chae Ko
(74) *Attorney, Agent, or Firm* — Scully, Scott, Murphy & Presser, P.C.; Daniel P. Morris, Esq.

(57) ABSTRACT

A processor-implemented method for determining aging of a processing unit in a processor the method comprising: calculating an effective aging profile for the processing unit wherein the effective aging profile quantifies the effects of aging on the processing unit; combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit.

24 Claims, 6 Drawing Sheets

(56) References Cited

U.S. PATENT DOCUMENTS

| | | |
|---|---|---|
| 2003/0125886 A1 | 7/2003 | Spitaels et al. |
| 2003/0154291 A1 | 8/2003 | Ocheltree et al. |
| 2004/0003303 A1 | 1/2004 | Oehler et al. |
| 2004/0264124 A1 | 12/2004 | Patel et al. |
| 2004/0268166 A1 | 12/2004 | Farkas et al. |
| 2005/0021279 A1* | 1/2005 | Kuepper et al. ............... 702/127 |
| 2007/0255972 A1* | 11/2007 | Gaskins et al. ............... 713/500 |
| 2008/0036487 A1* | 2/2008 | Bradley et al. ................ 324/765 |
| 2008/0036613 A1* | 2/2008 | Gaskins et al. ............... 340/584 |
| 2008/0082848 A1 | 4/2008 | Wang |
| 2008/0126748 A1* | 5/2008 | Capps et al. .................... 712/30 |
| 2008/0141072 A1* | 6/2008 | Kalgren et al. ................. 714/33 |
| 2008/0172578 A1 | 7/2008 | Tsai |
| 2009/0089033 A1* | 4/2009 | Ringering et al. ................ 703/7 |
| 2009/0271437 A1* | 10/2009 | Armour et al. ............ 707/104.1 |
| 2009/0287909 A1* | 11/2009 | Vera et al. ..................... 712/220 |
| 2009/0288092 A1* | 11/2009 | Yamaoka ...................... 718/104 |
| 2010/0017655 A1 | 1/2010 | Gooding et al. |
| 2010/0084991 A1 | 4/2010 | Liu et al. |
| 2010/0127881 A1 | 5/2010 | Schechter et al. |
| 2010/0306737 A1 | 12/2010 | Hamilton, II et al. |
| 2011/0016251 A1 | 1/2011 | Ho |
| 2011/0265090 A1* | 10/2011 | Moyer et al. .................. 718/103 |

OTHER PUBLICATIONS

Notice of Allowance dated Feb. 21, 2013 from related U.S. Appl. No. 12/727,984.

Alam, M. A. et al., "A Comprehensive Model of PMOS NBTI Degradation," Microelectronics Reliability, vol. 45, No. 2005, pp. 71-81, 2004.

Ogawa, S. et al., "Generalized Diffusion-Reaction Model for the Low-Field Charge-Buildup Instability at the Si-SiO2 Interface," Physical Review B, vol. 51, No. 7, pp. 4218-4230, 1995.

* cited by examiner

RELIABILITY AND PERFORMANCE OF A SYSTEM-ON-A-CHIP BY PREDICTIVE WEAR-OUT BASED ACTIVATION OF FUNCTIONAL COMPONENTS

CROSS-REFERENCE TO RELATED PATENT APPLICATIONS

The present invention is related to the following commonly-owned, co-pending United States Patent Applications filed on even date herewith, the entire contents and disclosure of each of which is expressly incorporated by reference herein as if fully set forth herein. U.S. patent application Ser. No. 12/684,367, filed Jan. 8, 2010, for "USING DMA FOR COPYING PERFORMANCE COUNTER DATA TO MEMORY"; U.S. patent application Ser. No. 12/684,172, filed Jan. 8, 2010, for "HARDWARE SUPPORT FOR COLLECTING PERFORMANCE COUNTERS DIRECTLY TO MEMORY"; U.S. patent application Ser. No. 12/684,190, filed Jan. 8, 2010, for "HARDWARE ENABLED PERFORMANCE COUNTERS WITH SUPPORT FOR OPERATING SYSTEM CONTEXT SWITCHING"; U.S. patent application Ser. No. 12/684,496, filed Jan. 8, 2010, for "HARDWARE SUPPORT FOR SOFTWARE CONTROLLED FAST RECONFIGURATION OF PERFORMANCE COUNTERS"; U.S. patent application Ser. No. 12/684,429, filed Jan. 8, 2010, for "HARDWARE SUPPORT FOR SOFTWARE CONTROLLED FAST MULTIPLEXING OF PERFORMANCE COUNTERS"; U.S. patent application Ser. No. 12/697,799, filed on Feb. 1, 2010, for "CONDITIONAL LOAD AND STORE IN A SHARED CACHE"; U.S. patent application Ser. No. 12/684,738, filed Jan. 8, 2010, for "DISTRIBUTED PERFORMANCE COUNTERS"; U.S. patent application Ser. No. 61/261,269, filed Nov. 13, 2009, for "LOCAL ROLLBACK FOR FAULT-TOLERANCE IN PARALLEL COMPUTING SYSTEMS"; U.S. patent application Ser. No. 12/684,860, filed Jan. 8, 2010, for "PAUSE PROCESSOR HARDWARE THREAD UNTIL PIN"; U.S. patent application Ser. No. 12/684,174, filed Jan. 8, 2010, for "PRECAST THERMAL INTERFACE ADHESIVE FOR EASY AND REPEATED, SEPARATION AND REMATING"; U.S. patent application Ser. No. 12/684,184, filed Jan. 8, 2010, for "ZONE ROUTING IN A TORUS NETWORK"; U.S. patent application Ser. No. 12/684,852, filed Jan. 8, 2010, for "PROCESSOR RESUME UNIT"; U.S. patent application Ser. No. 12/684,642, filed Jan. 8, 2010, for "TLB EXCLUSION RANGE"; U.S. patent application Ser. No. 12/684,804, filed Jan. 8, 2010, for "DISTRIBUTED TRACE USING CENTRAL PERFORMANCE COUNTER MEMORY"; U.S. patent application Ser. No. 13/008,602, filed Jan. 18, 2011, for "CACHE DIRECTORY LOOKUP READER SET ENCODING FOR PARTIAL CACHE LINE SPECULATION SUPPORT"; U.S. patent application Ser. No. 61/293,237, filed Jan. 8, 2010, for "ORDERING OF GUARDED AND UNGUARDED STORES FOR NO-SYNC I/O"; U.S. patent application Ser. No. 12/693,972, filed Jan. 26, 2010, for "DISTRIBUTED PARALLEL MESSAGING FOR MULTIPROCESSOR SYSTEMS"; U.S. patent application Ser. No. 12/688,747, filed Jan. 15, 2010, for "SUPPORT FOR NON-LOCKING PARALLEL RECEPTION OF PACKETS BELONGING TO A SINGLE MEMORY RECEPTION FIFO"; U.S. patent application Ser. No. 12/688,773, filed Jan. 15, 2010, for "OPCODE COUNTING FOR PERFORMANCE MEASUREMENT"; U.S. patent application Ser. No. 12/684,776, filed Jan. 8, 2010, for "MULTI-INPUT AND BINARY REPRODUCIBLE, HIGH BANDWIDTH FLOATING POINT ADDER IN A COLLECTIVE NETWORK"; U.S. patent application Ser. No. 13/004,007, filed Jan. 10, 2011, for "MULTI-PETASCALE HIGHLY EFFICIENT PARALLEL SUPERCOMPUTER"; U.S. patent application Ser. No. 12/984,252, filed Jan. 4, 2011, for "CACHE WITHIN A CACHE"; U.S. patent application Ser. No. 13/008,502, filed Jan. 18, 2011, for "MULTIPROCESSOR SYSTEM WITH MULTIPLE CONCURRENT MODES OF EXECUTION"; U.S. patent application Ser. No. 13/008,583, filed Jan. 18, 2011, for "READER SET ENCODING FOR DIRECTORY OF SHARED CACHE MEMORY IN MULTIPROCESSOR SYSTEM"; U.S. patent application Ser. No. 12/984,308 filed on Jan. 4, 2011, for "EVICT ON WRITE, A MANAGEMENT STRATEGY FOR A PREFETCH UNIT AND/OR FIRST LEVEL CACHE IN A MULTIPROCESSOR SYSTEM WITH SPECULATIVE EXECUTION"; U.S. patent application Ser. No. 12/984,329 filed Jan. 4, 2011, for "PHYSICAL ALIASING FOR THREAD LEVEL SPECULATION WITH A SPECULATION BLIND CACHE"; 61/293,552, filed Jan. 8, 2010, for "LIST BASED PREFETCH"; U.S. patent application Ser. No. 12/684,693, filed Jan. 8, 2010, for "PROGRAMMABLE STREAM PREFETCH WITH RESOURCE OPTIMIZATION"; U.S. patent application Ser. No. 13/004,005, filed Jan. 10, 2011, for "NON-VOLATILE MEMORY FOR CHECKPOINT STORAGE"; U.S. patent application Ser. No. 61/293,476, filed Jan. 8, 2010, for "NETWORK SUPPORT FOR SYSTEM INITIATED CHECKPOINTS"; U.S. patent application Ser. No. 12/696,746, filed on Jan. 29, 2010, for "TWO DIFFERENT PREFETCH COMPLEMENTARY ENGINES OPERATING SIMULTANEOUSLY"; U.S. patent application Ser. No. 12/697,015, filed on Jan. 29, 2010, for "DEADLOCK-FREE CLASS ROUTES FOR COLLECTIVE COMMUNICATIONS EMBEDDED IN A MULTI-DIMENSIONAL TORUS NETWORK"; U.S. patent application Ser. No. 12/727,984, filed Mar. 19, 2010, for "EFFICIENCY OF STATIC CORE TURN-OFF IN A SYSTEM-ON-A-CHIP WITH VARIATION"; U.S. patent application Ser. No. 12/697,043, Jan. 29, 2010, for "IMPLEMENTING ASYNCHRONOUS COLLECTIVE OPERATIONS IN A MULTI-NODE PROCESSING SYSTEM"; U.S. patent application Ser. No. 13/008,546, filed Jan. 18, 2011, for "ATOMICITY: A MULTI-PRONGED APPROACH"; U.S. patent application Ser. No. 12/697,175, filed Jan. 29, 2010 for "I/O ROUTING IN A MULTIDIMENSIONAL TORUS NETWORK"; U.S. patent application Ser. No. 12/684,287, filed Jan. 8, 2010 for ARBITRATION IN CROSSBAR FOR LOW LATENCY; U.S. patent application Ser. No. 12/684,630, filed Jan. 8, 2010, for "EAGER PROTOCOL ON A CACHE PIPELINE DATAFLOW"; U.S. patent application Ser. No. 12/723,277, filed Mar. 12, 2010 for EMBEDDED GLOBAL BARRIER AND COLLECTIVE IN A TORUS NETWORK; U.S. patent application Ser. No. 12/696,764, filed Jan. 29, 2010 for "GLOBAL SYNCHRONIZATION OF PARALLEL PROCESSORS USING CLOCK PULSE WIDTH MODULATION"; U.S. patent application Ser. No. 12/796,411, filed Jun. 8, 2010 for "GENERATION-BASED MEMORY SYNCHRONIZATION IN A MULTIPROCESSOR SYSTEM WITH WEAKLY CONSISTENT MEMORY ACCESSES"; U.S. patent application Ser. No. 12/796,389, filed Jun. 8, 2010 for BALANCING WORKLOAD IN A MULTIPROCESSOR SYSTEM RESPONSIVE TO PROGRAMMABLE ADJUSTMENTS IN A SYNCHRONIZATION INSTRUCTION; U.S. patent application Ser. No. 12/696,817, filed Jan. 29, 2010 for HEAP/STACK GUARD PAGES USING A WAKEUP UNIT; U.S. patent application Ser. No. 61/293,603, filed Jan. 8, 2010 for MECHANISM OF SUPPORTING SUB-COMMUNI- CATOR COLLECTIVES WITH O(64) COUNTERS AS OPPOSED TO ONE COUNTER FOR EACH SUB-COMMUNICATOR; and U.S. patent application Ser. No. 12/774,475, filed May 5, 2010 for "REPRODUCIBILITY IN A MULTIPROCESSOR SYSTEM".

PRIORITY CLAIM

This disclosure claims priority from U.S. Provisional Patent Application No. 61/293,559, filed on Jan. 8, 2010, the entire contents and disclosure of which is expressly incorporated by reference herein as if fully set forth herein.

STATEMENT REGARDING FEDERALLY SPONSORED RESEARCH OR DEVELOPMENT

The present disclosure was made with the U.S. Government support under Contract No.: B554331 awarded by the U.S. Department of Energy. The U.S. Government has certain rights in this disclosure.

TECHNICAL FIELD

The present disclosure generally relates to microprocessors and, more particularly, to improving reliability and performance of a system-on-a-chip (SOC).

BACKGROUND

Some parallel computing devices include node architectures based upon System-On-a-Chip (SOC) technology, i.e., each processing node comprises a single Application Specific Integrated Circuit (ASIC). Each ASIC node includes a plurality of processors, which may be used individually or simultaneously, to work on any combination of computations or communications as required by the particular algorithm being solved or executed at any point in time.

It is also generally desirable that each processor be reliable, durable and operational for a long period of time. Often however, extensive processor utilization rapidly ages its components, such as circuits and transistors, causing the systems in which these processors are used to slow down, experience some reduced performance or even result in failures of transistors in propagating their signals. This aging process may be attributed to factors such as Negatively Biased Temperature Instability (NBTI), Hot Carrier Injection Degradation (HCI) and Electro-Migration effects (EM).

Additionally, sensors based on ring oscillators may be used to measure the effects of processor aging. This type of measuring is done by placing the sensors in close proximity of processor components that are exposed to workload stress. Often however, this technique may not accurately predict processor aging because the sensors are unable to properly account for differences between themselves and the workload environment of the measured components. Moreover, the sensors' inherent mode of operation, wherein the sensors often operate in a way such that they age faster than the components they measure, does not allow for accurate prediction of aging because the sensors do not always have the same aging characteristics as the measured components.

Furthermore, the process of accurately predicting aging may be complicated by other factors such as operating conditions, workload variability and process variation. For example, some operating conditions that may affect the processor's mode of operation may include ambient temperatures, supply voltage ranges and operating frequency.

Also, workload characteristics, such as switching and clock-gating factors, may affect the ability to accurately predict aging. Switching factors, generally, describe how often a signal switches per clock cycle and thus may represent the probability that data bit may switch from '0' to '1', or '1' to '0'. Clock-gating factors, generally, represent the probability of how frequent the processor's clock is cut off in order to save power thereby inhibiting data-bit switch.

Additionally, process variation, which is often used to describe the variation in threshold voltages (VT) of transistors comprising the processor, may also affect the ability to accurately predict aging. For example, aging of processor's components, such as transistors, may be associated with a shift towards increasing VT, which leads to a reduction in some drain current in a way that the drain current can no longer change the processor's signals fast enough to meet the clock cycle-time requirement. Thus, when the VT shift reaches a level whereby the transistor cannot perform its function in the designated clock cycle-time, the transistor, and eventually the processor itself, may fail. Consequently, processor aging is a prediction, on a continuous timescale, of a number of correct operations until the first of such failures occurs. As a result, the processor aging may be calculated by predicting how much VT shift is sufficient to cause this failure. However, even this method is not adequately precise since often, due to imperfection in manufacturing processes, VT and aging rates may be different for the same transistor of the same design within the same processor. Therefore, processor pre-characterization, using transistor design-time simulations, is insufficient, at least, due to its inability to capture process variation as well as the architecture-level characteristics, such as redundancies and workload stress/sensitivities.

Accordingly, it would be desirable to accurately predict the processor's operational lifetime by assessing the aging characteristics at the architecture level in an environment where process variation exists.

SUMMARY

In light of the above, a method and a system of accurately estimating and adjusting for system-level aging are disclosed.

In accordance with one exemplary embodiment, there is disclosed a processor-implemented method for determining aging of a processing unit in a processor the method comprising: calculating an effective aging profile for the processing unit wherein the effective aging profile quantifies the effects of aging on the processing unit; combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit.

In accordance with another exemplary embodiment, there is disclosed a processor-implemented method for determining aging of a processing unit in a processor the method comprising: calculating an effective aging profile for the processing unit wherein the effective aging profile quantifies the effects of aging on the processing unit; exposing an aging analyzer to analogous workload factors as the processing unit wherein the age analyzer mimics a critical timing path of the processing unit the age analyzer measures; combining the effective aging profile, process variation data and aging analyzer data; and determining aging through the aging analyzer of the processing unit using the effective aging profile, the process variation data and the aging sensor data.

In accordance with yet another exemplary embodiment, there is disclosed a computer system for determining aging of a processing unit in a processor, the system comprising: a memory; a processor in communications with the computer memory, wherein the computer system is capable of performing a method comprising: calculating an effective aging profile for the processing unit wherein the effective aging profile quantifies the effects of aging on the processing unit; combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit.

In accordance with yet another exemplary embodiment, there is disclosed a computer program product for determining aging of a processing unit in a processor, the computer program product comprising: a storage medium readable by a processing circuit and storing instructions for execution by the processing circuit for performing a method comprising: calculating an effective aging profile for the processing unit wherein the effective aging profile quantifies the effects of aging on the processing unit; combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit.

In accordance with yet another exemplary embodiment, there is disclosed a computer system for determining aging of a processing unit in a processor, the system comprising: a memory; a processor in communications with the computer memory, wherein the computer system is capable of performing a method comprising: calculating an effective aging profile for the processing unit wherein the effective aging profile quantifies the effects of aging on the processing unit; exposing an aging analyzer to analogous workload factors as the processing unit wherein the age analyzer mimics a critical timing path of the processing unit the age analyzer measures; combining the effective aging profile, process variation data and aging analyzer data; and determining aging through the aging analyzer of the processing unit using the effective aging profile, the process variation data and the aging sensor data.

In accordance with yet another exemplary embodiment, there is disclosed a computer program product for determining aging of a processing unit in a processor, the computer program product comprising: a storage medium readable by a processing circuit and storing instructions for execution by the processing circuit for performing a method comprising: calculating an effective aging profile for the processing unit wherein the effective aging profile quantifies the effects of aging on the processing unit; exposing an aging analyzer to analogous workload factors as the processing unit wherein the age analyzer mimics a critical timing path of the processing unit the age analyzer measures; combining the effective aging profile, process variation data and aging analyzer data; and determining aging through the aging analyzer of the processing unit using the effective aging profile, the process variation data and the aging sensor data.

BRIEF DESCRIPTION OF THE DRAWINGS

The objects, features and advantages of the present disclosure will become apparent to one skilled in the art, in view of the following detailed description taken in combination with the attached drawings, in which.

The figures listed above depict various exemplary embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION OF THE PREFERRED EMBODIMENTS

Even though the discussion below is relevant to a single-core, dual-core or a multi-core processor, for clarity purposes, the discussion below will generally refer to a multi-core processor (referred to hereinafter as processor).

Moreover, the term "core," as used in the discussion below, generally refers to any computing block or a processing unit, with data storing and data processing/computing capability, or any combination of the two.

Furthermore, the term "memory," as used in the discussion below, generally refers to any computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), flash memory, solid state memory, firmware or any type of media suitable for storing electronic instructions.

Additionally, the term "effective aging profile" as used in the discussion below, may be interchangeably used with the term "predicted operational lifetime."

Also, it should be noted that at the design stage, a certain clock-frequency target, a thermal design point and a voltage is provided. However, at the manufacturing stage, due to process variation, the processor and its components may have different threshold voltages that are different than those assumed earlier at the design stage. Consequently, the processor and its components may require different supply voltages in order to run at the targeted frequency. Moreover, in the context of process variation, existing aging analysis and prediction techniques often do not provide accurate results. As a result, the processor aging is not predicted or prevented properly causing longer down-time and less reliable processors.

Finally, all contents of U.S. Pat. Nos. 7,472,038 and 7,486,107 are hereby expressly incorporated by reference herein as if fully set forth herein.

Figure 1:
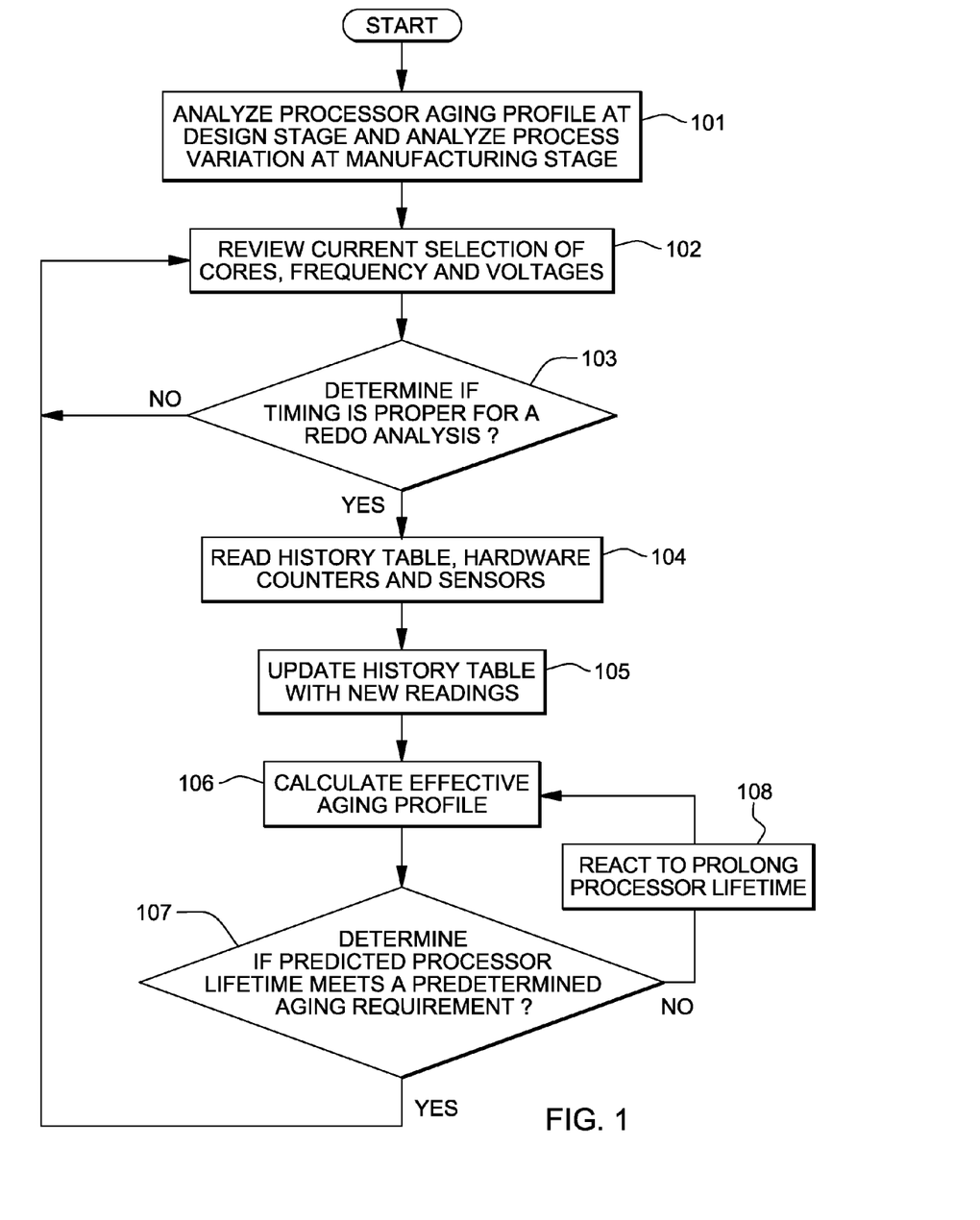
FIG. 1 symbolically illustrates an exemplary depiction of a general overview flowchart of a process to prolong processor operational lifetime.

FIG. 1 illustrates an exemplary embodiment of a general overview flowchart of a process to prolong processor operational lifetime. The process to prolong processor operational lifetime begins at step 101 with an analysis of a processor aging profile at a design stage and a process variation analysis of the processor at a manufacturing stage.

The design stage data that may be relevant for this analysis may include, for example, architecture redundancy, circuit characteristics, target frequency and assumed switch factors. The manufacturing stage data that may be relevant for this analysis may include, for example, threshold voltages, as measured by aging sensors, and supply voltages, as determined by manufacturing tests. The design and manufacturing stage data may form the inputs for calculating effective aging for each core of the processor using an aging model, such as a Diffusion-Reaction (hereinafter DR) model or any of its derivative models or any other aging models for estimating the operating lifetime of a processor. Furthermore, different aging models can be used for different components/parts/structure/steps in the method or the system.

The calculation of effective aging may occur at the manufacturing facility after the processor has been manufactured. The data that is output from the calculation of effective aging for each core of the processor may be stored in a data structure, such as a history table, which may be stored in memory internal or external to the processor. In one embodiment, history table is table in which various kinds of information related to the calculation of effective aging profile are registered, stored, organized and capable of being retrieved from for later use by the processor or logic device.

A list and description of some exemplary known aging models may be found at http://www.iue.tuwien.ac.at/phd/wittmann/node10.html#SECTION001020000000000000000. Other exemplary known aging models are described in 'M. A. Alam and S. Mahapatra, "A Comprehensive Model of PMOS NBTI Degradation," Microelectronics Reliability, vol. 45, no. 2005, pp. 71-81, 2004' and 'S. Ogawa and N. Shiono, "Generalized Diffusion-Reaction Model for the Low-Field Charge-Buildup Instability at the Si—SiO2 Interface," Physical Review B, vol. 51, no. 7, pp. 4218-4230, 1995' and 'M. A. Alam, "A Critical Examination of the Mechanics of Dynamic NBTI for PMOSFETs," in Proc. Int. Electron Devices Meeting (IEDM), pp. 14.4.1-14.4.4, 2003.' All contents of all documents cited in this paragraph are hereby expressly incorporated by reference herein as if fully set forth herein.

At step 102, a review of current selection of operating cores of the processor, their frequency and their voltages is done. This review is done in order to be later used for effective aging profile calculation.

At step 103, a determination is made if the aging has exceeded the threshold for a redo analysis. This determination is made in order to determine if it is necessary to reconfigure the processor's current operating settings. It should be noted that different types of aging may have different indicators to trigger this determination. For example, while timing a measurement of signal propagation speed in transistors may be an adequate indicator for NBTI-induced aging, for other types of aging, such as EM, timing may not be the proper indicator.

Furthermore, it should be noted that this determination is architecture and technology dependent. For example, the redo analysis timing for a 45 nm processor architecture may be different for a 22 nm processor architecture. Regardless, if a determination is made that aging has not exceeded for a redo analysis i.e. none of the matching preexisting criteria that trigger the redo analysis are met, then the process loops to step 102. Otherwise, the process continues to step 104.

At step 104, a reading of data stored in the history table occurs. This reading, the execution of which may be triggered by the core, may also include data from other sources such as hardware counters, thermal sensors and aging sensors. The data from this reading is received by the processor or like logic device.

At step 105, an update is made to the history table, wherein the cells in the history table are populated with new data received from hardware counters, thermal sensors and aging sensors. The execution of this update may be triggered by the core.

At step 106, an effective aging profile is calculated and stored in the history table with a corresponding time stamp. The execution of calculation of the effective aging profile may be triggered by a core to measure its own or other cores' effective aging profile. It is possible that after this calculation, the hardware counters and thermal sensors may be reset and the corresponding entries in the history table may be cleared in order to allow for subsequent storing of new information for the time interval beginning from after the current calculation until the next time when effective aging profile needs to be recalculated.

Moreover, at the time of recalculation of the effective aging profile, the history table may receive the data from the aging sensors from each core of the processor. These readings may provide an accurate estimate of how much aging has occurred to the aging sensor itself when it was exposed to the switching factors of 1.0. Accordingly, by using the temperature, variation, voltage and frequency information gathered from step 101, and assuming switching factors of 1.0, the estimated aging rate of the aging sensor may be calculated. By comparing the estimated aging rate and the actual aging rate from measuring the aging sensor, coefficients in the aging model may be recalibrated in order to specifically account for process variation at that core. The effective aging profile calculation then may use, in one embodiment, the aging model with the calibrated coefficients, to recalculate the predicted operational lifetime for the core. The calculation may use information from history table that may include switching factors as measured by the hardware counters, the temperature as measured by thermal sensors, frequency and voltage and the previous predicted operational lifetime (and VT-shift) of the cores. The effective aging profile may also account for architecture redundancy.

Additionally, on a system that supports Dynamic Frequency and Voltage Scaling (DVFS), where frequencies and supply voltages of each core could change when going into less demanding tasks or idle state to save power, effective aging profile calculation may be recalculated in response to occurrence of these events, or the voltage/frequency states can be recorded and used later for recalculating effective aging profile.

Effective aging profile is calculated at pre-determined periods appropriate for the corresponding aging process. For example, effective aging profile may be calculated and updated once in a few days or any time period that is relevant for the operating/server and workload conditions. It is also possible to customize the update frequency interval.

Figure 2:
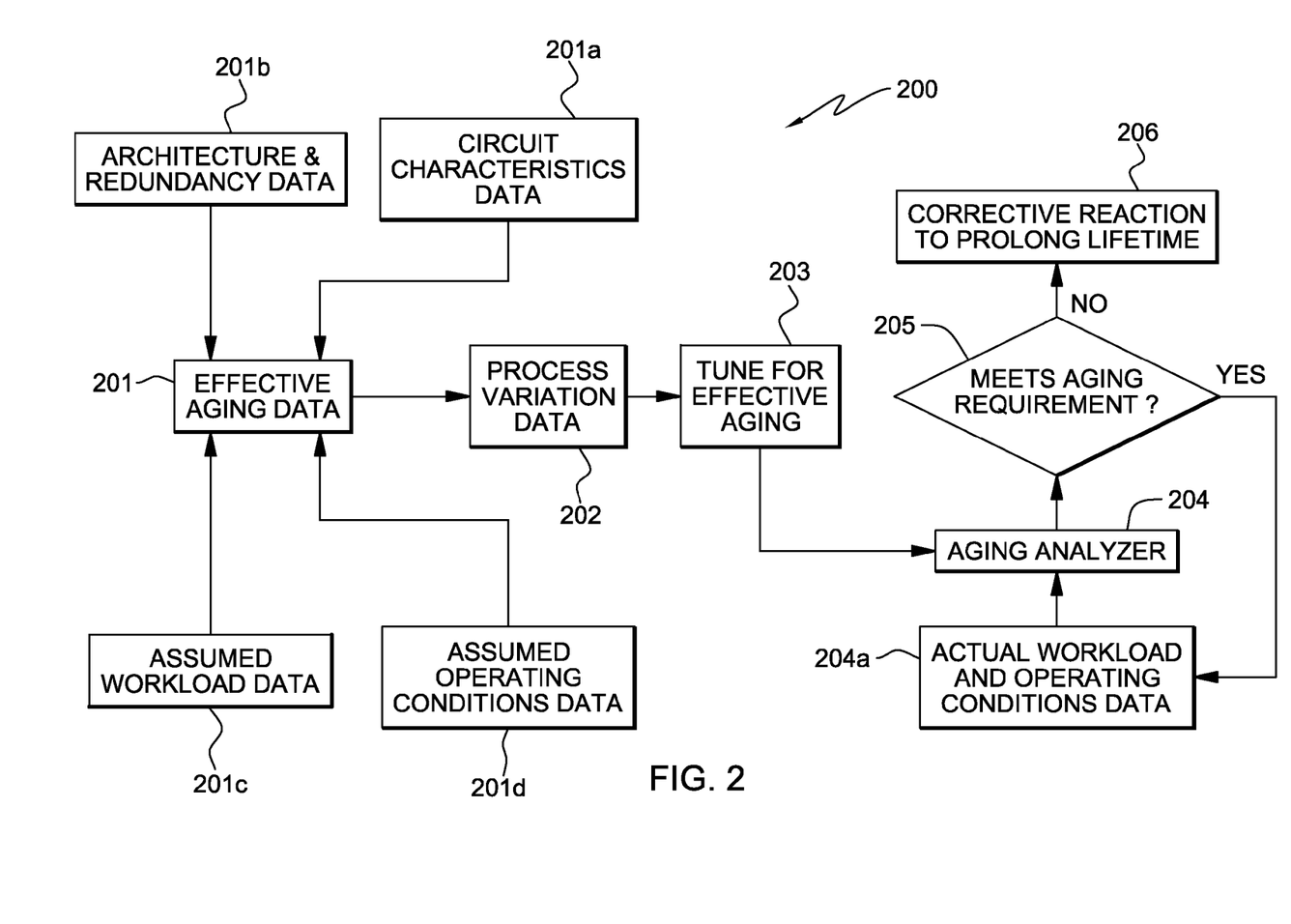
FIG. 2 symbolically illustrates an exemplary depiction of a flow diagram implementing the process of FIG. 1.
Figure 3:
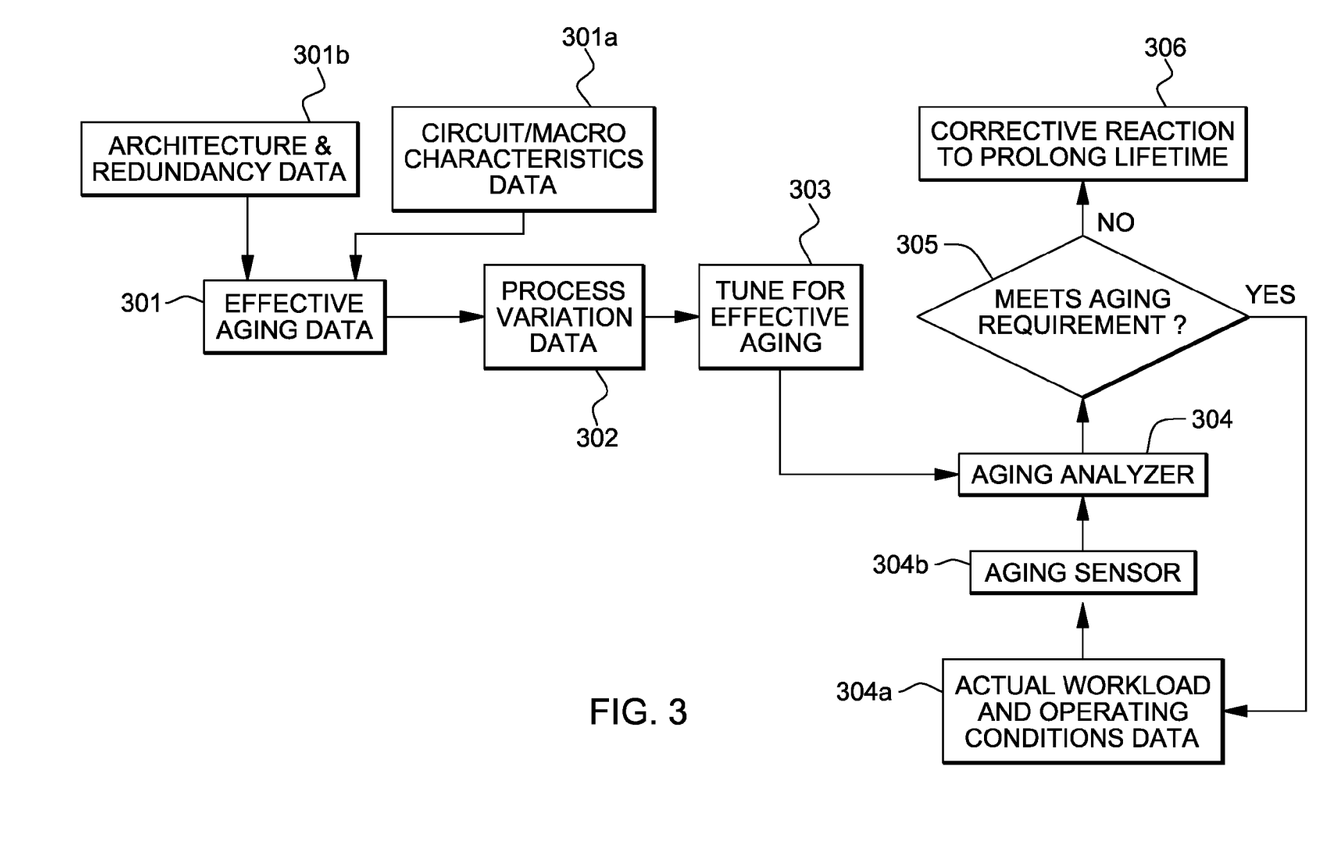
FIG. 3 symbolically illustrates an exemplary depiction of a flow diagram implementing the process of FIG. 1.

The steps shown in the FIGS. 2 and 3 are interchangeable—in other embodiments the sequence can change, yet still refer to the contents of this disclosure in one embodiment, the step of factoring in on-chip variation can be done in Age analyzer stage (step 101) or during the effective aging profile calculation (step 106). Similarly architectural-characteristics and redundancy information can be factored in effective aging profile calculation stage (step 106) or age analyzer stage (step 101) in different embodiments.

Furthermore, the time period frequency at which effective aging profile may be calculated may relate to a change in the voltage, frequency or workload as detected by hardware counters or by thermal sensors, or as requested by a user when a system-level event such as rebooting, changing workload, Operating Systems (OS) context switch, OS-driven idle period, periodic maintenances or when frequency/voltage are changed by OS to conserve energy.

Current literature on transistor level aging models provides detailed dependencies for voltage, temperature and other parameters. For example, aging simulations are ran on a processor core using voltage of 1.0V, frequency of 2 Ghz and fixed temperature of 85° C., assuming switching factor of 1.0. The circuit characteristics, such as cycle-time constraint, threshold voltage, circuit types and circuit criticality, are known in advance since they are designed in advance.

During processor operation, the processor uses hardware counters, and aging and temperature sensors to capture data relating to the actual operating conditions and supply voltage. Next, the processor may supply this data to a software module or a logic circuit which calculates aging profile. In microprocessor architecture, often, aging profile is a vector that covers different types of components with different aging characteristics. In one embodiment, aging profile can be a vector. Yet, for sake of simplicity, we use value for the rest of the test and its use should not be construed as limiting. Thus, if the chip was actually running at 0.8V, frequency of 1.4 Ghz and varying temperatures between 60-85° C., the hardware counters measure switching factor to be 0.21. Because these conditions are different, and the processor has also been used for a while, thus already using up some life time, the aging profile metric has to be recalculated.

At step 107, a determination is made if the processor's predicted operational lifetime meets a predetermined aging requirement. If a determination is made that the processor's predicted operational lifetime meets the predetermined aging requirement, then the process loops to step 102. Otherwise, the process continues to step 108.

At step 108, a corrective reaction to prolong processor operational lifetime occurs and then the process loops to step 106. An example of the corrective reaction may include, but not be limited to, any of the following: 1) an adjustment in the supply voltage while maintaining the same frequency, 2) an adjustment in the frequency with the same or lower supply voltage, 3) a reduction in the workload, such as an increase in the amount of idle time of the processor or a reduction in the number of operating cores, 4) a selective shut-down of cores that have short operational lifetimes and a performance of workload scheduling by using cores that have sufficiently long operational lifetimes, 5) a determination of whether task migration of application processing activity at one core in favor of another core is possible and if the workload requires less cores than the total number of cores on the processor, then whether one can schedule the cores to run the workload such that each core has sufficient time to rest and 6) a matching of the busiest or hottest tasks in the workload to the cores that have higher operational lifetime. The reactions above may be used individually or in combination in order to meet the processor's operational lifetime requirement. The determination of which corrective action to take may be pre-programmed in advance by a predetermined heuristic.

FIG. 2 symbolically illustrates an exemplary depiction of a flow diagram implementing the process of FIG. 1. System 200 includes effective aging data block 201, process variation data block 202, tune for effective aging block 203, effective aging profile block 204, determination of aging requirement block 205 and reaction to prolong lifetime block 206.

Block 201 performs step 101 depicted in FIG. 1. At design stage, when a processor's logic design has been completed, one can predict, based on ideal manufacturing conditions, without process variation, the aging profile of the processor, a circuit processor or a logic block by simulating operation for any items of interest and by taking into consideration certain technical characteristics related to the item of interest.

In one example, block 201, which may be a logic circuit programmed to perform its function, receives data from inputs 201a-d which relate to circuit characteristics, architecture redundancy, assumed workload data and assumed operating conditions, respectively. Data from inputs 201a-d may be used for determining the aging profile (ideal processor operational lifetime) by calculating the effective aging for each core of the processor using an aging model. The formula and coefficients are stored in the history table for later use in calculating an effective aging profile when actual workload and operating conditions are available. Alternatively, the formula and coefficients may be stored in memory, internal or external to the processor, where the core or processor controller can have access to when they calculate the operational lifetime.

Data received from input 201a is related to circuit and device characteristics such as the connectivity of logic/SRAM design, target cycle time, gate oxide thickness and capacitance and VT.

In one embodiment, data received from input 201b is related to architecture characteristics and redundancy such as the duplication of critical components of a system with the intention of increasing reliability of the system as often done in the case of a backup or fail-safe. In a different embodiment, the architecture data and redundancy information are taken into account at the aging analyzer stage.

Data received from input 201c is related to workload data such as assumed clock-gating factors and switching factors.

Data received from input 201d is related to assumed operating conditions such as voltage, frequency and temperature.

The output of block 201 (aging profile) is then input into block 202 where it is compared to process variation data (expected core lifetime based on actual physical measuring of the core at the post-manufacturing stage). Process variation measurements may be done by determining VT using aging sensors or by applying different voltages to the processor and measuring the propagation speed of each component. Block 202 may be a logic circuit programmed to perform its function. The output of block 202 may then be passed to the processor's controller, which may then optimize the global chip lifetime based on core values.

The output of block 202 is then fed into block 203 where tuning for effective aging occurs. Since process variation and processor aging profile characteristics are not deterministic and have wafer and chip-level (or even finer-grain) characteristics, process variation data and the aging profile characteristics are fed into the effective aging profile unit to tune it for the specific processor. The design and manufacturing stage data may be used for calculating effective aging for each core of the processor using an aging model, for example, the DR model or other model. The calculation of effective aging may occur at the manufacturing facility after the processor has been manufactured. The data that is output from the calculation of effective aging for each core of the processor may be stored in a history table, which may be stored in memory internal or external to the processor. History table is table in which various kinds of information related to the calculation of effective aging profile are registered, stored, organized and capable of being retrieved from for later use. Block 202 may be a logic circuit programmed to perform its function and be configured to store the calibrated formula and coefficients mentioned above.

Block 204a performs steps 102-105 depicted in FIG. 1. During processor's operation, readings from the thermal sensors, aging sensors and hardware counters are automatically, frequently, routinely and continuously read and stored in the history table in order to be later used for effective aging profile calculation.

Block 204 performs step 106 depicted in FIG. 1. The execution of calculation of the effective aging profile may be triggered by a core to measure its own or other cores' effective aging profile. Block 204 may be a logic circuit programmed to perform its function. Because the aging sensors are exposed to the fixed switching factor of 1.0, they ages faster than the actual core and its components. Therefore, the processor does not rely directly on aging sensor alone to predict the lifetime of its cores, but rather the aging sensor readings are used to estimate an accurate lifetime prediction through calculating the effective aging profile.

When it is time to recalculate effective aging profile, the history table reads the data output from aging sensors from each core of the processor. The aging sensor readings provide an accurate estimate of how much aging has occurred to the aging sensor when exposed to the switching factors of 1.0.

By using the temperature, voltage, frequency and process variation information from blocks 201-203, and assuming switching factors of 1.0, the estimated aging rate of the aging sensor may be calculated. By comparing the estimated aging rate and the actual aging rate from measuring of the aging sensor, recalibration of coefficients in the aging model, to tailor specifically to the processor to account for process variation, may be possible.

The effective aging profile calculation may then use the aging model with the calibrated coefficients, to recalculate the predicted operational lifetime for the core. The calculation may use the information from the history table that may include switching factor as measured by the hardware counters, the temperature as measured by thermal sensors, frequency and voltage and the previous predicted operational lifetime (and VT-shift) of the cores.

It is possible that after this calculation, the hardware counters and thermal sensors may be reset and the corresponding entries in the history table may be cleared in order to allow for new information storing for the time interval beginning from after the current calculation until the next time when effective aging profile needs to be recalculated. Also, if effective aging profile needs to be recalculated, data from aging sensors may be read and stored in the history table. The calculated effective aging profile may also be stored in history table for future use. A time stamp detailing when the reading is made may also be stored in the table in order to associate with each aging sensor reading.

Because aging is a slow process, the effective aging profile does not need to be calculated and updated frequently. For example, effective aging profile may be calculated and updated once in a few days. It is also possible to customize the update frequency interval.

Also, the time period frequency at which effective aging profile may be calculated may relate to a sudden change in the voltage, frequency or workload as detected by hardware counters or by thermal sensors, or as requested by a user when a system-level event such as rebooting, changing workload, Operating Systems (OS) context switch, OS-driven idle period, periodic maintenances or when frequency/voltage are changed by OS to conserve energy.

Upon calculation of the effective aging profile, block 204 feeds block 205 a data signal in the format of a number, a metric, a symbol or a variable. The execution of calculation of the aging requirement may be triggered by a core to measure its own or other cores' results. Block 205 may be a logic circuit programmed to perform its function. Block 205 performs step 107 depicted in FIG. 1. If a determination is made if the processor's predicted operational lifetime meets a predetermined aging requirement, then the process loops to step 204a. However, if a determination is made that the processor's predicted operational lifetime does not meet a predetermined aging requirement, then a signal to block 206 is output.

Aging requirement comprises of a performance and a lifetime target, where the performance target may be a clock-frequency or sustained number of operations per second such as a number of Floating Point Operations per Seconds (FLOPS). The lifetime target may be the number of cores that can sustain the performance target for at least the period of time desired for the workload until the first failure. Block 206 performs step 108 depicted in FIG. 1. The execution of a corrective action may be triggered by a core to measure its own or other cores' results. Block 206 may be a logic circuit programmed to perform its function. An example of the corrective reaction may include, but not be limited to, any of the following: 1) an adjustment in the supply voltage while maintaining the same frequency, 2) an adjustment in the frequency with the same or lower supply voltage, 3) a reduction in the workload, such as an increase in the amount of idle time of the processor or a reduction in the number of operating cores, 4) a selective shut-down of cores that have short operational lifetimes and a performance of workload scheduling by using cores that have sufficiently long operational lifetimes, 5) a determination of whether task migration of application processing activity at one core in favor of another core is possible and if the workload requires less cores than the total number of cores on the processor, then whether one can schedule the cores to run the workload such that each core has sufficient time to rest and 6) a matching of the busiest or hottest tasks in the workload to the cores that have higher operational lifetime. The reactions above may be used individually or in combination in order to meet the processor's operational lifetime requirement. The determination of which corrective action to take may be pre-programmed in advance by a pre-determined heuristic.

FIG. 3 symbolically illustrates an exemplary depiction of a flow diagram implementing the process of FIG. 1. The implementation as depicted in FIG. 3 is similar to the implementation of FIG. 2. However, the main difference is presence of a structure known as an age-analyzer, which mimics each of the critical timing paths of the core and is exposed to the same workload conditions as the components that they measure. This is done in order that the difference between sensors and workload conditions of the measured components can be measured.

Furthermore, the term "workload-induced conditions" as discussed in reference to FIG. 3, may generally be characterized by, but not limited to, clock-gating factors, switching factors, voltage, frequency and temperature.

Additionally, because the numbers of bits in the core or within any of its components could be substantial, the hardware counters can be programmed to sample switching factors of only a subset of bits of the critical components or of components that are more prone to switching, or to compress the bits using functions, such as XOR, before computing their switching factors.

In one embodiment, block 304b corresponds to steps performed by an age-analyzer which is constructed such that it mimics the operation of the core it is trying to predict the aging of. The age-analyzer captures critical information in terms of the architectural characteristics of the core, types of logic and such. Because the age-analyzer closely mimics the operation of the core, the age-analyzer provides a more direct prediction of aging from its reading and reduces the need for further computations of complicated models. The age-analyzer may include or make use of aging sensors.

In different embodiments architectural characteristics and redundancy information can be taken into account in different stages. In one embodiment, the architectural characteristics and redundancy information is factored in calculating the effective aging profile. In another embodiment, the architectural characteristics and redundancy information is factored in at the aging analyzer stage, but not in effective aging profile. Specifically, if a core has several pipeline stages and its critical path is likely to be limited by some of the stages that have a combination of VT devices, SRAM and wire capacitance, then the age-analyzer will have a component mimic each of the critical paths. For example, if a core has two critical paths, one consists of 40% high-VT transistors and 60% SRAM, and the other consists of 40% high-VT transistors and 60% wire, then the age-analyzer will be structured to have two structures, one consists of 40% high-VT transistors and 60% SRAM, and the other consists of 40% high-VT transistors and 60% wire.

The structure of the age-analyzer can also be designed to reflect redundancy present in the core wherein each of the core structures (main and spares) has a mimic in the age-analyzer. To closely mimic the workload conditions of the core, block 304b is not receiving data from block 304a. Rather, block 304b actually mimics the workload switching activities that are output from block 304a. For example, if block 304a outputs a signal with a switch factor of 0.4, then block 304b is also forced to switch with factor 0.40 (switching 40% of times). By measuring the timing of each of the sensor structures in the age-analyzer, as exemplarily shown in FIG. 6, the age-analyzer tunes to the input aging profile vector of the core and provides a final aging profile indicating the overall aging profile of the core as well as information on which parts of the architecture are at aging risk. A core is considered not meeting its lifetime requirement in block 305 if any of the age-analyzer structures indicate critical aging conditions, and there are no redundant or spare components present to extend the core's lifetime; in which block 306 will perform step 108 depicted in FIG. 1.

Figure 4:
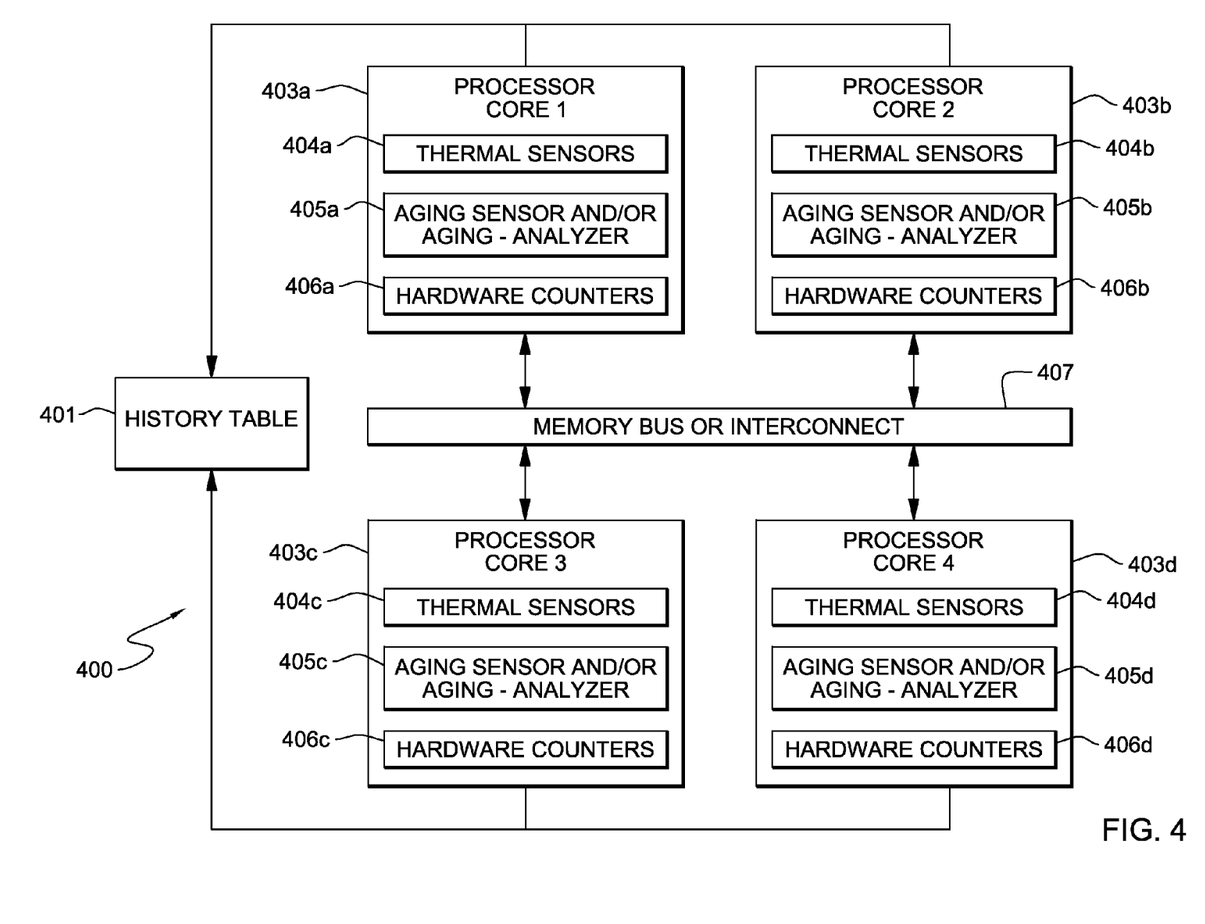
FIG. 4 symbolically illustrates a functional block diagram of an exemplary embodiment of a structure of a system configured to implement the process of FIG. 1.

FIG. 4 graphically illustrates a functional block diagram of an exemplary embodiment of a structure of a system configured to implement the process of FIG. 1.

FIG. 4 shows a structure of a processor 400, which includes four processor cores 403a-d. Each of the processor cores 403a-d is operably coupled to a memory bus or interconnect 407, in order to exchange data among the cores and with main memory or other input/output units. Cores 403a-d also correspondingly include four thermal sensors 404a-d, four aging sensors and/or age-analyzers 405a-d, and four hardware counters 406a-d, all of which are operably coupled to history table 401.

Although only one aging sensor and/or age-analyzer 405a-d is shown in each core, aging sensors and/or age-analyzers 405a-d may include multiple instances and various implementations of age sensors and age-analyzers, internal or external to the core, customized for the circuit characteristic. In one embodiment, aging sensors and/or age-analyzers 405a-d may be placed in multiple locations that are critical in timing and thus most likely to run out of lifetime early. In another embodiment, aging sensors and/or age-analyzers 405a-d may comprise of multiple implementations of circuit blocks, such as inverter chains, SRAM, combinational logic chains, accumulators, MUXes, latches of different types, and multiple transistor types, such as high-VT transistors and low-VT transistors, stacked and non-stacked transistors. Additionally, even though only one thermal sensor and one hardware counter are shown within each core 403a-d, thermal sensor 404a-d and hardware counters 406a-d could include multiple instances, customized for the component of interest within any or all cores 403a-d.

Thermal sensors 404a-d are a type of hardware that may be implemented, for example, as a diode or a ring oscillator. Thermal sensors 404a-d collect temperatures for core components units or cores 403a-d that are more likely to have shorter operational lifetimes.

Aging sensors and/or age-analyzers 405a-d are a type of hardware that may be implemented, for example, as a ring oscillator. Aging sensors and/or age-analyzers 405a-d are exposed to the workload switching factor of 1.0 (switching every clock-cycle) or other fixed value. An initial reading of aging sensors and/or age-analyzers 405a-d, while in the manufacturing stage, provides process variation profile, while subsequent readings help calculate VT shifting rate. Thus, by comparing the initial readings done at design stage and manufacturing stage (or any other previous readings) to the subsequent readings, aging can be predicted based how much threshold-voltage-shift (VT-shift) has occurred over time.

Hardware counters 406a-d are a type of hardware registers that keep count on events of interest within processor 400. For example, types of hardware counters 406a-d that may be used include instruction and processor cycle counters, counters that count number of cycles a certain unit is used or counters that count how many bits are switched for a set of states in a certain unit over a period of time. Hardware counters 406a-d are used to collect information on switching factors of cores 403a-d or core components unit. In the interest of filtering information, hardware counters 406a-d may be customized and thus designed to collect only switching factors that represents the critical paths of cores 403 a-d that are more likely to have shorter operational lifetimes.

Furthermore, because the numbers of bits in the core or in any of its components could be substantial, the hardware counters can be programmed to sample switching factors of only a subset of bits of the critical components or of components that are more prone to switching, or to compress the bits using functions, such as XOR, before computing their switching factors.

In this exemplary embodiment, at design stage of processor 400, a certain clock-frequency target, a thermal design point and a voltage are assumed. However, at the manufacturing stage, due to process variation, multi-core processor 400 and its components will have different threshold voltages that are different than those assumed earlier by the design stage. As a result, multi-core processor 400 and its components will require different supply voltages among cores 403a-d and within cores 403a-d in order to run at the targeted frequency. The information from design stage, such as architecture redundancy, circuit characteristics, target frequency and assumed switch factors, and information from manufacturing stage, such as threshold voltages as measured by aging sensors and supply voltages as determined by manufacturing tests, faun the inputs for calculating effective aging for each core 403a-d using the aging model. The calculation of effective aging may occur at the manufacturing facility after the processor has been manufactured. The data that is output from the calculation of effective aging for each core of the processor may be stored in a history table, which may be stored in memory internal or external to the processor.

In one embodiment, during operation of multi-core processor 400, readings from thermal sensors 404a-d, aging sensors and/or age-analyzers 405*a-d* and hardware counters 406*a-d* are automatically, frequently, routinely and continuously read and stored in history table 401. In order to more efficiently store these readings, history table 401 can store thermal sensors 404*a-d* readings in the form of average temperatures taken over a certain period of time, aging sensors and/or age-analyzers 405*a-d* readings in the form of VT and hardware counters 406*a-d* readings in the form of switch probability over time.

Since computer system using multi-processor 400 may be shut-down or restarted, history table 401 is adapted and configured to store its values by implementing history table 401 in persistent storage such as memory. Due to possibility of data failure, a copy of history table 401 may also be backed up in persistent storage such as memory.

When effective aging profile needs to be recalculated, data from aging sensors and/or age-analyzers 405*a-d* is read and stored in history table 401 with a corresponding time stamp. The execution of calculation of the effective aging profile may be triggered by any of cores 403*a-d* to measure its own or other cores' effective aging profile.

Additionally, since aging is a slow process, the effective aging profile does not need to be calculated and updated frequently. For example, effective aging profile may be calculated and updated once in a few days. It is also possible to customize the update frequency interval.

Moreover, on a system that supports Dynamic Frequency and Voltage Scaling (DVFS), where frequencies and supply voltages of each core could change when going into less demanding tasks or idle state to save power, the effective aging profile calculation can be redone these changes happen, or the voltage/frequency states can be recorded and used later for recalculating effective aging profile.

Also, the time period frequency at which effective aging profile may be calculated may relate to a sudden change in the voltage, frequency or workload as detected by hardware counters or by thermal sensors, or as requested by a user when a system-level event such as rebooting, changing workload, Operating Systems (OS) context switch, OS-driven idle period, periodic maintenances or when frequency/voltage are changed by OS to conserve energy.

When it is time to recalculate effective aging profile, history table 401 again reads data from aging sensors and/or age-analyzers 405*a-d* for each core 403*a-d*. These readings provide an accurate estimate of how much aging has occurred to aging sensors and/or age-analyzers 405-*d* when they were exposed to the switching factors of 1.0.

By using the temperature, variation, voltage and frequency information from effective aging, and assuming switching factors of 1.0, one can calculate the estimated aging rate of aging sensors and/or age-analyzers 405*a-d*. By comparing the estimated aging rate and the actual aging rate from the measuring output from aging sensors and/or age-analyzers 405*a-d*, one can recalibrate the coefficients in the aging model to tailor specifically to the chip to account for process variation.

The effective aging profile calculation then uses the aging model with the calibrated coefficients, to recalculate the protected lifetime for the core. The calculation uses information from history table 401 that include switching factor as measured by the hardware counters 406*a-d*, the temperature as measured by thermal sensors 404*a-d*, frequency and voltage and the previous predicted operational lifetime (and VT-shift) of the cores 401*a-d*. The effective aging profile may also account for architecture redundancy.

It is possible that after this calculation, hardware counters 406*a-d* and thermal sensors 404*a-d* may be reset and the corresponding entries in history table 401 may be cleared in order to allow for new information storing for the time interval beginning from after the current calculation until the next time when effective aging profile needs to be recalculated.

Figure 5:
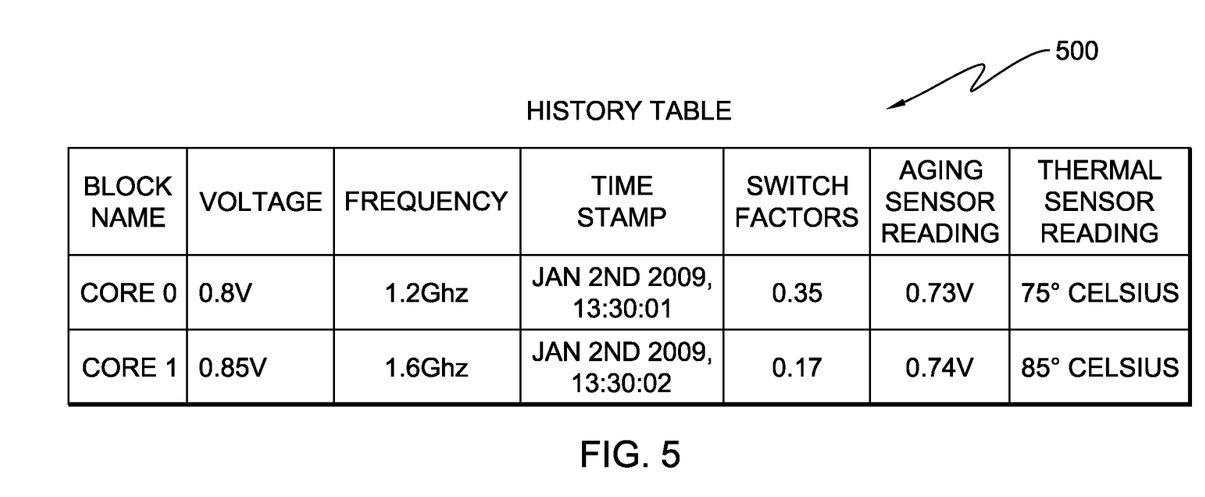
FIG. 5 symbolically illustrates an exemplary depiction of a history table.

FIG. 5 symbolically illustrates an exemplary depiction of a history table. History table 500 is a data structure which performs the function of a table in which various kinds of information related to the calculation of effective aging profile are registered, stored, organized and capable of being retrieved from for later use. In history table 500, each row may correspond to some identification information of a core or a logic block from which data is being collected. History table 500 may be stored in memory, which may be internal or external to the processor.

Each column within history table 500 represents a type of data collected from a core or a logic block that is being monitored. Within history table 500, 'Block name' column stores the identification data related to the monitored item of interest such as a core, a circuit or a logic block. 'Voltage' and 'Frequency' columns store values collected at runtime that describe the supplied voltage (VDD) and clock frequency of the measured item, respectively. 'Time stamp' column stores values of the time and date of when the time stamp value was measured. 'Switch factors' column stores probability values, which are measured from corresponding hardware counters of how often the bits switch in the measured item. 'Aging sensor reading' column stores values obtained from aging sensors and/or age-analyzers (see FIG. 4), which may be a number of trips made by the ring oscillator in a fixed period of time. This number may be translated to VT using a lookup table provided by simulations of the ring oscillator at the design stage. 'Thermal sensor reading' column stores values obtained from thermal sensors.

Figure 6:
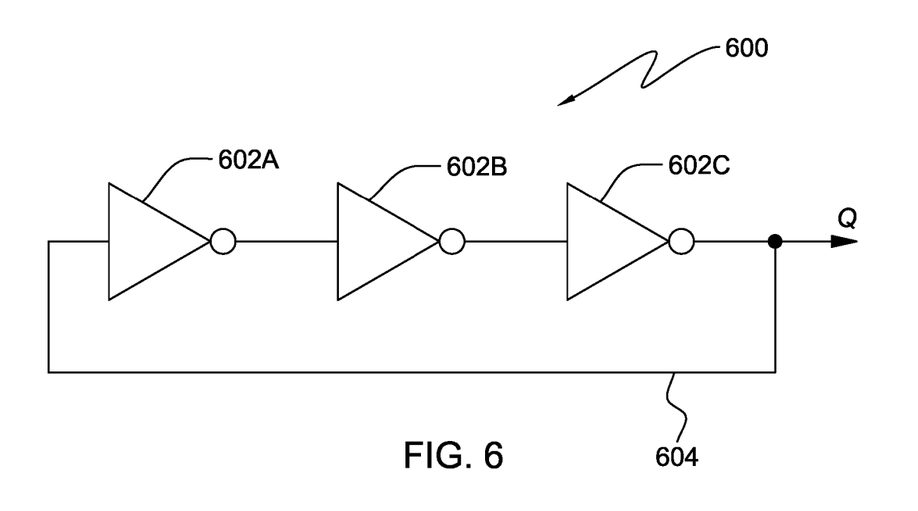
FIG. 6 symbolically illustrates an exemplary embodiment of a ring oscillator used, in one embodiment, as the aging sensor.

FIG. 6 symbolically illustrates an exemplary embodiment of a ring oscillator used, in one embodiment, as the aging sensor. FIG. 6 shows a structure of a ring oscillator 600, which includes three inverters 602*a-c* operably attached in a chain 606. The output of last inverter 602*c* is fed back into the first inverter 602*a*.

Additionally, an aging sensor 600 may be implemented using a number of different kinds of logic such as SRAM, ring oscillators, inverter chains, with different aging characteristics that sufficiently mimic the critical components of the processor cores, individually or using the aforementioned combinations. The process of tuning with a given aging profile number implies finding these representative combinations and generating the conditions that represent the aging profile number.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident, software, micro-code, etc.) or an embodiment combining software and hardware aspects that may all generally be referred to herein as a "circuit," "module" or "system."

Furthermore, aspects of the present disclosure may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of disclosed herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the FIGS. 1-6 illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although the embodiments of the present disclosure have been described in detail, it should be understood that various changes and substitutions can be made therein without departing from spirit and scope of the disclosure as defined by the appended claims. Variations described for the present disclosure can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present disclosure.

Reference in the specification to "one embodiment" or to "an embodiment" means that a particular feature, structure, or characteristic described in connection with the embodiments is included in at least one embodiment. The appearances of the phrase "one embodiment" in various places in the specification are not necessarily all referring to the same embodiment.

We claim:

1. A processor-implemented method for determining aging of a processing unit in a processor, the method comprising:

calculating an effective aging profile for the processing unit, wherein the effective aging profile quantifies the effects of aging on the processing unit, wherein the effective aging profile is based at least in part upon at least one aging profile coefficient, and wherein the aging profile coefficient has an initial value;

combining the effective aging profile with process variation data, actual workload data and operating conditions data for the processing unit;

determining aging through an aging sensor of the processing unit using the effective aging profile, the process variation data, the actual workload data, architectural characteristics and redundancy data, and the operating conditions data for the processing unit;

recalibrating the aging profile coefficient based at least in part upon the determined aging to generate a modified value for the aging profile coefficient; and recalculating the effective aging profile, wherein the recalculated effective aging profile is based at least in part upon the aging profile coefficient modified value.

2. The method of claim 1, further comprising matching the aging sensor configuration to an effective aging profile.

3. The method of claim 2, further comprising commencing a corrective reaction to prolong the processor's operational lifetime.

4. The method of claim 3, wherein the corrective reaction includes at least one of the following: adjusting supply voltage, adjusting frequency, reducing a workload, selectively shutting down a processing unit, scheduling a workload, executing task migration, matching a workload to a processing unit.

5. The method of claim 1, wherein the effective aging profile for the processing unit is calculated using an aging model, the aging model using circuit characteristics data, architecture characteristics, redundancy and criticality data, assumed workload data and assumed operating conditions data.

6. The method of claim 5, wherein process variation is factored in the calculation of effective aging profile using the aging model.

7. The method of claim 1, wherein the step of calculating the effective aging profile of the processing unit using the effective aging data, the process variation data, the actual workload data and the operating conditions data is performed using an aging model.

8. A processor-implemented method for determining aging of a processing unit in a processor, the method comprising:

calculating an effective aging profile for the processing unit wherein the effective aging profile quantifies the effects of aging on the processing unit;

exposing an aging analyzer to analogous workload factors as the processing unit wherein the aging analyzer mimics a critical timing path of the processing unit the aging analyzer measures;

combining the effective aging profile, process variation data and aging analyzer data; and determining aging through the aging analyzer of the processing unit using the effective aging profile, the process variation data and the aging sensor data.

9. The method of claim 8, further comprising matching the aging analyzer configuration to an effective aging profile.

10. The method of claim 9, further comprising commencing a corrective reaction to prolong the processor's operational lifetime.

11. The method of claim 10, wherein the corrective reaction includes at least one of the following: adjusting supply voltage, adjusting frequency, reducing a workload, selectively shutting down a processing unit, scheduling a workload, executing task migration, matching a workload to a processing unit.

12. The method of claim 8, wherein the effective aging profile for the processor unit is calculated using an aging model, the aging model using circuit/macro characteristics data and architecture redundancy data.

13. The method of claim 12, wherein process variation is factored in the calculation of effective aging profile using the aging model.

14. The method of claim 8, wherein the step of calculating the effective aging profile of the processing unit using the effective aging profile, the process variation data and the aging sensor data is performed using an aging model.

15. A computer system for determining aging of a processing unit in a processor, the system comprising:

a memory;

a processor in communications with the computer memory, wherein the computer system is capable of performing a method comprising:

calculating an effective aging profile for the processing unit wherein the effective aging profile quantifies the effects of aging on the processing unit, wherein the effective aging profile is based at least in part upon at least one aging profile coefficient, and wherein the aging profile coefficient has an initial value;

combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit;

recalibrating the aging profile coefficient based at least in part upon the determined aging to generate a modified value for the aging profile coefficient; and recalculating the effective aging profile, wherein the recalculated effective aging profile is based at least in part upon the aging profile coefficient modified value.

16. The computer system of claim 15, further comprising matching the effective aging profile to a predetermined aging requirement and commencing a corrective reaction to prolong the processor's operational lifetime.

17. The computer system of claim 16, wherein the corrective reaction includes at least one of the following: adjusting supply voltage, adjusting frequency, reducing a workload, selectively shutting down a processing unit, scheduling a workload, executing task migration, matching a workload to a processing unit.

18. The computer system of claim 15, wherein the effective aging profile for the processing unit is calculated using an aging model, the aging model using circuit characteristics data, architecture characteristics, redundancy and criticality data, assumed workload data and assumed operating conditions data, and the combination of the effective aging profile with process variation data, actual workload data and operating conditions data for the processing unit is performed using the aging model, and the step of determining aging through aging analyzer of the processing unit using the effective aging profile, the process variation data, the actual workload data, architectural characteristics and redundancy data, and the operating conditions data for the processing unit is performed using the aging model.

19. A computer readable storage device having computer readable program code logic tangibly embodied therein to execute at least one machine instruction in a processing circuit, the at least one machine instruction being for determining aging of a processing unit in a processor, the at least one machine instruction performing a method comprising:

calculating an effective aging profile for the processing unit wherein the effective aging profile quantifies the effects of aging on the processing unit, wherein the effective aging profile is based at least in part upon at least one aging profile coefficient, and wherein the aging profile coefficient has an initial value;

combining the effective aging profile with process variation data, actual workload data and operating conditions data for the processing unit; and determining aging through an aging sensor of the processing unit using the effective aging profile, the process variation data, the actual workload data, architectural characteristics and redundancy data, and the operating conditions data for the processing unit;

recalibrating the aging profile coefficient based at least in part upon the determined aging to generate a modified value for the aging profile coefficient; and recalculating the effective aging profile, wherein the recalculated effective aging profile is based at least in part upon the aging profile coefficient modified value.

20. A computer system for determining aging of a processing unit in a processor, the system comprising:

a memory;

a processor in communications with the computer memory, wherein the computer system is capable of performing a method comprising:

calculating an effective aging profile for the processing unit wherein the effective aging profile quantifies the effects of aging on the processing unit;

exposing an aging analyzer to analogous workload factors as the processing unit wherein the aging analyzer mimics a critical timing path of the processing unit the aging analyzer measures;

combining the effective aging profile, process variation data and aging analyzer data; and determining aging through the aging analyzer of the processing unit using the effective aging profile, the process variation data and the aging sensor data.

21. The computer system of claim 20, further comprising matching the effective aging profile to a predetermined aging requirement and commencing a corrective reaction to prolong the processor's operational lifetime.

22. The computer system of claim 21, wherein the corrective reaction includes at least one of the following: adjusting supply voltage, adjusting frequency, reducing a workload, selectively shutting down a processing unit, scheduling a workload, executing task migration, matching a workload to a processing unit.

23. The computer system of claim 20, wherein the effective aging profile for the processing unit is calculated using an aging model, the aging model using circuit/macro characteristics data and architecture redundancy data, and the combination of the effective aging profile, process variation data and aging sensor data is performed using the aging model, and the step of determining aging through aging analyzer of the processing unit using the effective aging profile, the process variation data and the aging sensor data is performed using the aging model.

24. A computer readable storage device having computer readable program code logic tangibly embodied therein to execute at least one machine instruction in a processing circuit, the at least one machine instruction being for determining aging of a processing unit in a processor, the at least one machine instruction performing a method comprising:

calculating an effective aging profile for the processing unit wherein the effective aging profile quantifies the effects of aging on the processing unit;

exposing an aging analyzer to analogous workload factors as the processing unit wherein the aging analyzer mimics a critical timing path of the processing unit the aging analyzer measures;

combining the effective aging profile, process variation data and aging analyzer data; and determining aging through the aging analyzer of the processing unit using the effective aging profile, the process variation data and the aging sensor data.

* * * * *